United States Patent

Takamoto et al.

[11] Patent Number: 5,345,122
[45] Date of Patent: Sep. 6, 1994

[54] CASCADE SENSE AMPLIFIER FOR READING OUT DATA STORED IN SEMICONDUCTOR MEMORY DEVICE

[75] Inventors: Hiroshi Takamoto, Tokyo; Takenori Nakamura, Yokohama; Kenichi Nakamura, Tokyo, all of Japan

[73] Assignee: Kabushiki Kaisha Toshiba, Kawasaki, Japan

[21] Appl. No.: 51,305

[22] Filed: Apr. 22, 1993

[30] Foreign Application Priority Data

Apr. 23, 1992 [JP] Japan .................................. 4-104799

[51] Int. Cl.⁵ .......................... H03F 3/45; H03K 5/22
[52] U.S. Cl. ..................................... 307/530; 307/355; 307/591; 307/543
[58] Field of Search ................. 307/530, 355, 591, 543

[56] References Cited

U.S. PATENT DOCUMENTS 4,991,141 2/1991 Tran ..................................... 307/530

OTHER PUBLICATIONS

IBM Tech. Disc. Bul. "Charge-Sensitive Sense Amplifier" Crabtree et al., vol. 21 No. 9, Feb. 1979 pp. 3707–3709.

Primary Examiner—Margaret R. Wambach
Attorney, Agent, or Firm—Foley & Lardner

[57] ABSTRACT

A cascade sense amplifier includes section separated sense amplifiers, a cascade wiring and a main sense amplifier. The main sense amplifier has a capacitance regulation element provided at a base potential of input transistors constituting a data input end. The element is comprised of a metal oxide semiconductor (MOS) transistor for forming a capacitance corresponding to a potential $V_{SS}$ mainly forming a capacitance by the cascade wiring. A size of the element is determined in the manner that the base potential drop time of the transistors is equal to a potential drop time of the cascade wiring when a power source voltage $V_{CC}$ drops. Even though the power source voltage $V_{CC}$ drops, the transistors have no cut-off condition so as to prevent the read-out time from delaying. Especially, if the element is comprised of a MOS transistor, it is possible to use an extremely thin gate insulation layer as a dielectric, thereby suppressing an increase of a chip size.

7 Claims, 8 Drawing Sheets

FIG. 1 PRIOR ART (a) $V_{CC}$ (b) POTENTIAL OF DI & *DI (c) OUTPUT OF SENSE AMPLIFIER SAmain

To: POINT OF POTENTIAL DROP (a) $V_{CC}$ (b) POTENTIAL OF DI & *DI (c) OUTPUT OF SENSE AMPLIFIER SAmain

(a) POTENTIALS OF $D_{IN}$ & $XD_{IN}$

(b) CURRENTS OF TrD & TrE (c) POTENTIALS OF DI & *DI (d) CURRENTS OF TrB & TrC (e) OUTPUT OF SENSE AMPLIFIER SAmain

CASCADE SENSE AMPLIFIER FOR READING OUT DATA STORED IN SEMICONDUCTOR MEMORY DEVICE

BACKGROUND OF THE INVENTION

The present invention relates to a cascade sense amplifier for reading out data stored in a semiconductor memory device, and more particularly, to a cascade sense amplifier which includes a plurality of section separated sense amplifiers provided in each of a plurality of section cell array each storing data, a pair of cascade wires in which signals respectively showing different logic levels flow and its one end to which the section separated sense amplifiers are commonly connected, and a main sense amplifier provided at the other end of the pair cascade wires.

There are conventionally semiconductor memory devices which have cascade amplifiers constituted by bipolar transistors and metal oxide semiconductor (MOS) transistors, and sectional cell arrays storing data which are read by the cascade amplifiers.

Figure 1:
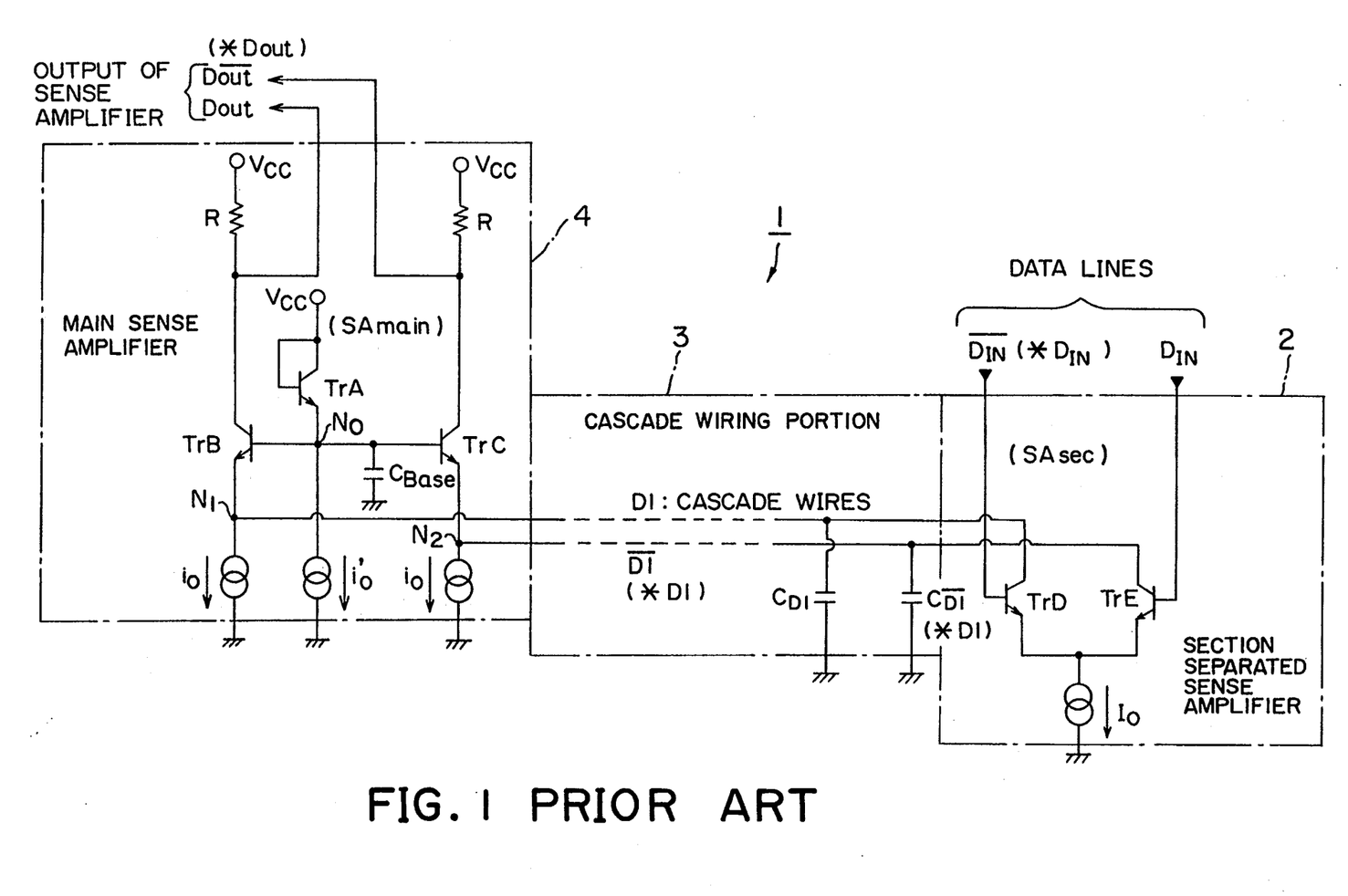
FIG. 1 is a circuit diagram showing a conventional cascade amplifier with its capacitive constitution, which is constituted by bipolar transistors and MOS transistors and reads out data stored in section cell array of a semiconductor memory device.

FIG. 1 shows a circuitry with respect to such a kind of the conventional semiconductor memory devices.

In FIG. 1, at respective ends (not shown) of data line $D_{IN}$ and $*D_{IN}$, there are provided a plurality of memory cell array (not shown in FIG. 1) each of in which a plurality of memory cells are arranged in a matrix. Here, in this specification, a symbol of "*" means an inverted signal line, and $*D_{IN}$ is a signal line in which an inverted signal of $D_{IN}$ flows. A cascade sense amplifier 1 shown in FIG. 1 comprises a plurality of section separated sense amplifiers 2 to which the other respective ends of the data lines $D_{IN}$ and $*D_{IN}$ are connected, a cascade wiring portion 3 including pair of cascade wires $D_1$ and $*D_1$ each having one respective ends to which the section separated sense amplifiers are commonly connected, and a main sense amplifier 4 which is connected to the other respective ends of the cascade wires $D_1$ and $*D_1$.

The section separated sense amplifier 2 includes a differential pair comprised of NPN-type transistors $Tr_D$ and $Tr_E$, and a constant current source 2a constituted such by an N-channel metal oxide layer semiconductor (MOS) transistor or the like. Emitters of the transistors $Tr_D$ and $Tr_E$ are commonly connected to the constant current source 2a. A base of the transistor $Tr_D$ is connected to the data line $*D_{IN}$, and a base of the transistor $Tr_E$ is connected to the data line $D_{IN}$.

The cascade wiring portion 3 comprises the cascade wire $D_1$ connected to a collector of the transistor $Tr_D$, and the cascade wire $*D_1$ connected to a collector of the transistor $Tr_E$. Here, symbols $C_{D1}$ and $*C_{D1}$ show parasitic capacitance existing in the cascade wires $D_1$ and $*D_1$, respectively.

The main amplifier 4 comprises NPN-type bipolar transistors $Tr_A$, $Tr_B$ and $Tr_C$, collectors of which are connected to the power source $V_{CC}$ and outputs $D_1$ and $*D_1$, respectively, constant current sources 4a and 4b comprised of such as N-channel MOS transistors provided on emitter sides of transistors $Tr_B$ and $Tr_C$, respectively, and a constant current source 4c provided on an emitter side of the transistor $Tr_A$. The transistors $Tr_B$ and $Tr_C$ constitute a differential pair, two resistors, and the constant current sources 4a and 4b supply the constant current $i_0$ for a bias respectively corresponding to the transistors $Tr_B$ and $Tr_C$. The transistor $Tr_A$ is connected by a diode connection, and the transistor $Tr_A$ and the constant current source 4c are connected to bases of the transistors $Tr_B$ and $Tr_C$ through a node $N_O$ to bias these transistors $Tr_B$ and $Tr_C$. A symbol $C_{Base}$ denotes a parasitic capacitance existing in the main amplifier.

In the above-mentioned semiconductor memory device, the section separated sense amplifier ($SA_{sec}$) 2 senses a logical condition of data by an amplitude of scores mV, and the main sense amplifier ($SA_{main}$) 4 amplifies a sensed condition of data to an amplitude of "$I_O.R$" to output, thereby suppressing a potential change to be smaller on the cascade wires $D_1$ and $*D_1$, and preventing as smaller as the deterioration of the invert speed on the basis of the parasitic capacitance between the semiconductor substrate and metal wiring of the cascade wires $D_1$ and $*D_1$.

The above condition will now be described more detail by using a parasitic capacitance shown in FIG. 1.

As shown in FIG. 1, the cascade wires $D_1$ and $*D_1$ have parasitic capacitance $C_{D1}$ and $*C_{D1}$, respectively. Accordingly, inverted time of respective potentials $V_{D1}$ and $*V_{D1}$ of the cascade wires $D_1$ and $*D_1$ are represented as follows:

$$t_O = \Delta V_{D1} \times C_{D1} \text{ (or } *C_{D1}\text{)}/i_O$$

where $t_O$ is inverted time, $\Delta V_{D1}$ is a potential change in the cascade wire $D_1$ and $*D_1$.

Accordingly, the smaller the potential change $\Delta V_{D1}$ is, the shorter the inverted time is, thereby enabling a high-speed read-out for the data.

However, since the data read-out cycle shows a tendency to be shortened by the high-speed operation in the conventional semiconductor memory device, the power sources $V_{CC}$ and $V_{SS}$ change easily by circuit noises activated in the read-out cycle, thereby providing new troublesome for obstructing the high-speed read-out of the data.

Figure 2:
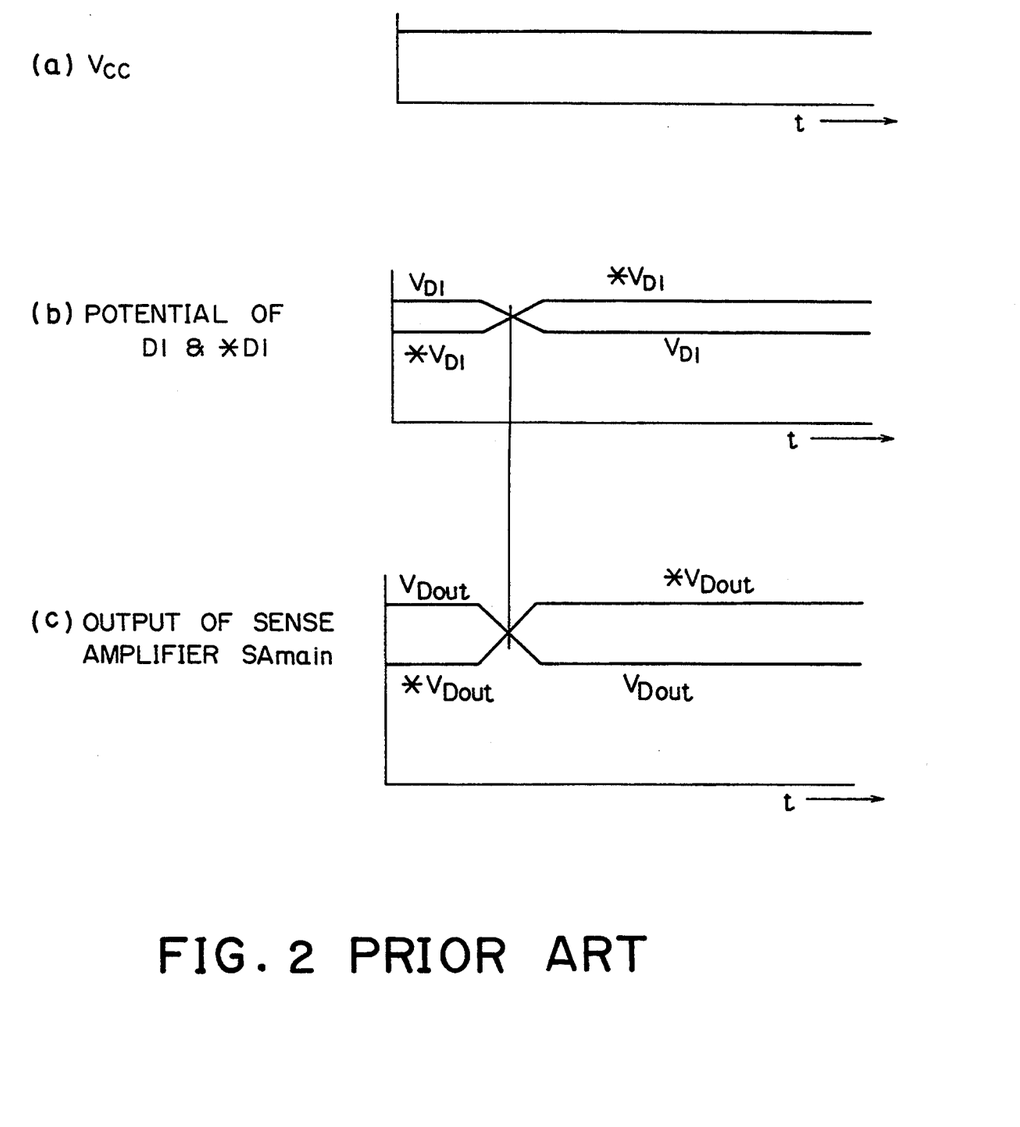
FIG. 2 is a timing chart showing a waveform complying condition of a potential of a cascade wiring portion and a sense output of the main sense amplifier at inverting the data line potential when the source potential does not drop in the amplifier shown in FIG. 1.

Namely, if the source $v_{CC}$ does not change, the sense output of the main sense amplifier ($SA_{main}$) 4 complies with an inversion of the cascade wire $D_1$ or $*D_1$ with high fidelity as shown in FIG. 2.

Figure 3:
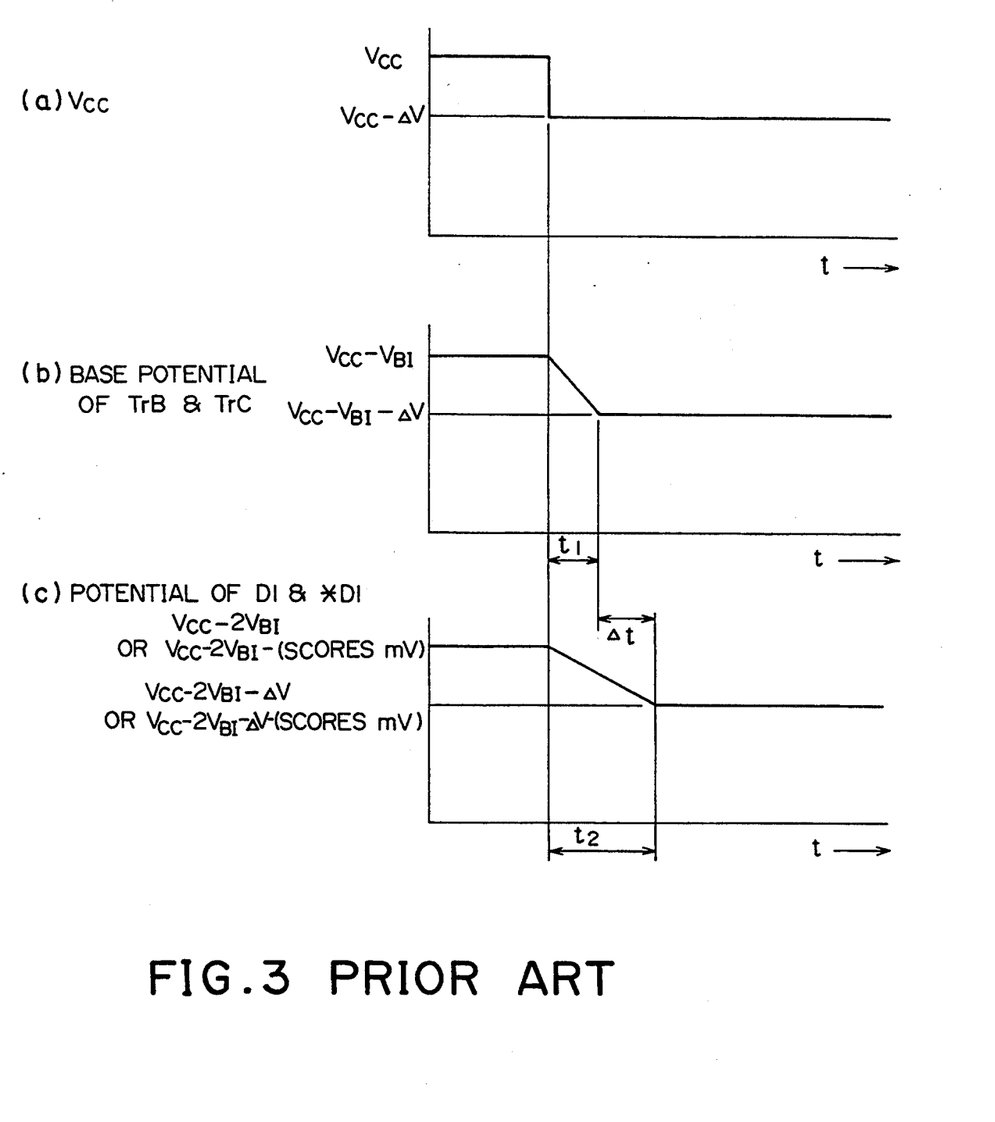
FIG. 3 is a timing chart showing a waveform complying condition of the potential of the cascade wiring portion and the sense output of the main sense amplifier at inverting the data line potential when the source potential drops in the amplifier shown in FIG. 1.
Figure 4:
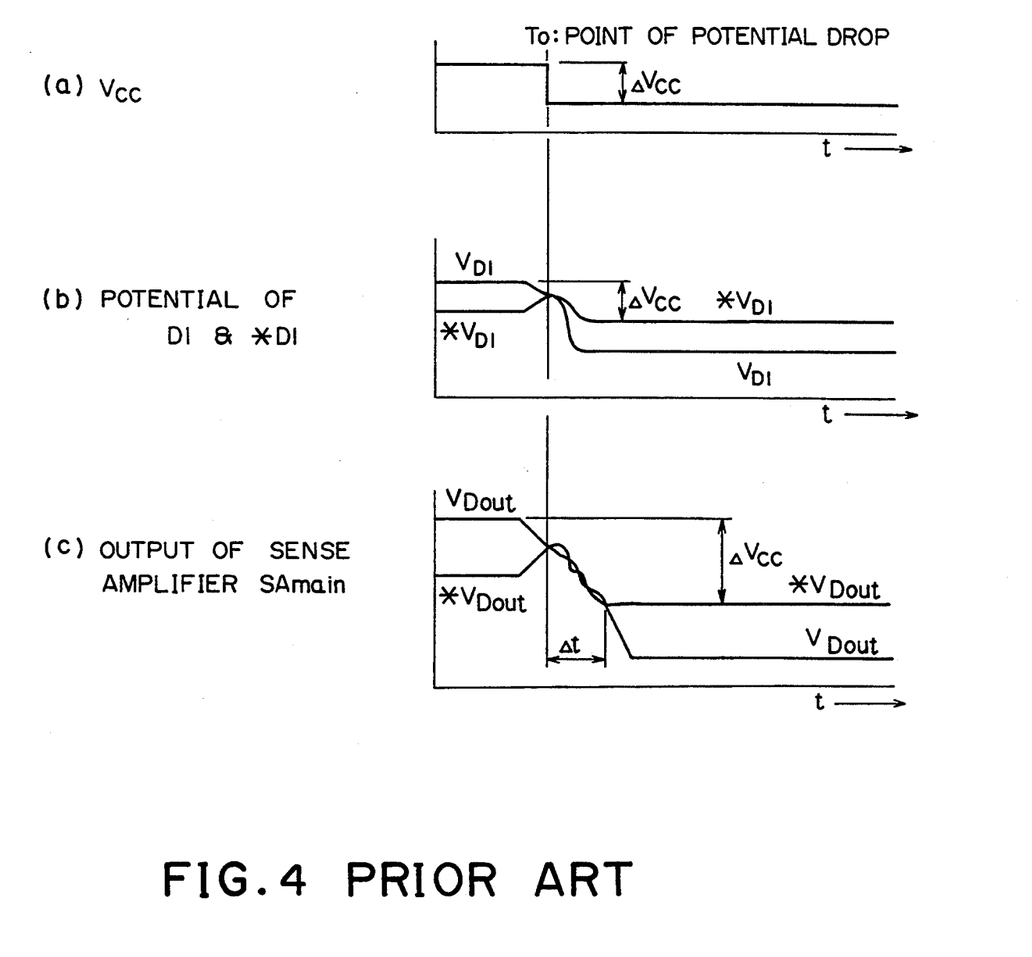
FIG. 4 is a timing chart showing a waveform complying condition of the base potential drop of the input transistor and the potential drop of the cascade wiring portion which constitute the main sense amplifier when the source potential drops in the amplifier shown in FIG. 1.

However, when the power source $V_{CC}$ drops at inverting potentials in the data lines $D_{IN}$ and $*D_{In}$, there occurs a defective phenomenon shown in FIGS. 3 and 4. This phenomenon can be analyzed as follows:

The amplifier first has a parasitic capacitance $C_{D1}$ and $*C_{D1}$ in the cascade wires $D_1$ and $*D_1$ and has a parasitic capacitance $C_{Base}$ between the semiconductor substrate and the bases of the transistors $Tr_B$ and $Tr_C$.

When the power source $V_{CC}$ changes, the potential of the cascade wires $C_{D1}$ and $*C_{D1}$ and the base potential of the transistors $Tr_B$ and $Tr_C$ comply with the change of $V_{CC}$. The base potential change time $t_1$ of the transistors $Tr_B$ and $Tr_C$ and the potential change time $t_2$ of the cascade wires $C_{D1}$ and $*C_{D1}$ are represented by the followings:

$$t_1 = C_{Base} \times \Delta V_{CC}/i_O$$

$$t_2 = C_{D1} \text{ (or } *C_{D1}\text{)} \times \Delta V_{CC}/i_O.$$

Accordingly, since the potentials $C_{Base}$ and $C_{D1}$ (or $*C_{D1}$) are the large factors to determine the potential change times $t_1$ and $t_2$, the relationship for sizes between the capacitances $C_{Base}$ and $C_{D1}$ (or $*C_{D1}$) results to generate the problem.

Namely, the capacitance $C_{D1}$ (or $*C_{D1}$) in the cascade wires $D_1$ and $*D_1$ is schematically constituted from a wiring capacitance $C_1$ necessary for wiring the cascade wire $D_1$ (or $*D_1$) and a collector capacitance $C_j$ of the bipolar transistors which are necessarily added with each section cell array. Since a number of the sense amplifiers ($SA_{sec}$) 2 increase according to the enlargement of the memory capacity and the cascade wires $D_1$ and $*D_1$ are formed for a long distance on the chip, both of the wiring capacitance $C_1$ and the collector capacitance $C_j$ increase. Accordingly, a relationship for an amount of the capacitance $C_{Base}$ and $C_{D1}$ (or $*C_{D1}$) is "$C_{Base} < C_{D1}$ (or $*C_{D1}$)" as clearly understood from a number of the sense amplifier ($SA_{sec}$) 2. In this connection, there is a large difference between the capacitance $C_{Base}$ and $C_{D1}$ (or $*C_{D1}$) because $C_{Base}$ is 0.1 pF while $C_{D1}$ (or $*C_{D1}$) is 2–3 pF.

The relationship for an amount between capacitance $C_{Base}$ and $C_{D1}$ (or $*C_{D1}$) cause a relationship between the potential change times $t_1$ and $t_2$ to generate the difference ($t_1 < t_2$), thereby resulting a shortage condition in a voltage $V_{BE}$ between a base and emitter of the transistor $Tr_B$ (or $Tr_C$) by the differential $\Delta t$. Here, the voltage $V_{BE}$ between a base and emitter can be represented as follows:

$$V_{BE} = V_B - V_E = (V_{CC} - V_{BI}) - (V_{CC} - 2V_{BI} - \alpha) = -V_{BI} + \alpha$$

Where $\alpha$ is scores mV. In order to maintain an On state of the transistor $Tr_B$ (or $Tr_C$), the relationship of "$V_{BE} > V_{BI} + \alpha$" should be satisfied. On the contrary, as shown in FIG. 4, when the base potential of the transistor $Tr_B$ (or $Tr_C$) drops faster than the potential drop of the cascade wires $D_1$ and $*D_1$, thereby resulting a condition of "$V_{BE} < V_{BI} + \alpha$" during $\Delta t$, and causing the transistor $Tr_B$ (or $Tr_C$) to be a cut-off condition. Therefore, as shown in FIG. 4(c), the sense outputs $V_{Dout}$ and $*V_{Dout}$ become an unfixed condition during the period of $\Delta t$, thereby disabling the amplifier from reading out the data. Accordingly, the read-out of the data delays by $\Delta t$ and requires an extra time.

In conclusion, in FIG. 1, when the voltage $V_{CC}$ changes (increases or drops), the node $n_O$ changes in accordance with the change of the voltage $V_{CC}$. However, the potential of the cascade wires $D_1$ and $*D_1$ changes slowly in comparison with the potential change of the node $N_O$. An original potential difference between the base and emitter of the transistors $Tr_B$ and $Tr_C$ should be near $V_{BI}$, but discrepancy between the changes of the node $N_O$ and the cascade wires $D_1$ and $*D_1$ on the basis of the change of the voltage $V_{CC}$ causes the potential difference between the base and emitter of both transistors $Tr_B$ and $Tr_C$ to be smaller than $V_{BI}$ (in case of $V_{CC}$ drop), and to be larger than $V_{BI}$ (in case of $v_{CC}$ increase). As a result, respective collector current of the transistors $Tr_B$ and $Tr_C$ flows little (when $V_{CC}$ drops), and flows too much (when $V_{CC}$ increases), so that the amplitude of output is not correct.

SUMMARY OF THE INVENTION

In view of the above-mentioned problem included in the conventional cascade sense amplifier, an object of the present invention is to provide a cascade sense amplifier which does not generate an OFF-state of a differential pair of a main sense amplifier even when the power source $V_{CC}$ drops, thereby preventing the read-out speed from delay so as to keep a high-speed read-out of the data.

The cascade sense amplifier of the present invention comprises a plurality of section separated sense amplifiers provided corresponding to each of section array and for sensing data stored in the section array, a cascade wiring portion for commonly connecting entire outputs of the plurality of sense amplifiers, a main sense amplifier for amplifying a sensed output sensed by the sense amplifiers through the cascade wiring portion, and a capacitance regulation element for regulating a capacitance of a base potential of a bipolar transistor constituting a data input portion of the main sense amplifier.

The capacitance regulation element can constitute a configuration in the manner that a capacitance forms corresponding to a potential the same as that mainly formed by the cascade wiring portion.

Furthermore, the capacitance regulation element may constitute by using an N-channel MOS transistor.

Still furthermore, a size of the capacitance regulation element is required to be determined in the manner that a base potential drop time of the bipolar transistor in the main sense amplifier is equal to the potential drop time of the cascade wiring portion when the higher potential drops.

According to the present invention, since the regulation of the capacitance of the base potential of the bipolar transistor constituting the data input portion of the main sense amplifier by the capacitance regulation element, can set the potential drop time of the cascade wiring portion equal to the base potential drop time when the source potential of the higher potential side drops, even when the power source $V_{CC}$ drops, there is no cut-off condition in the differential pair of the main sense amplifier, thereby preventing the read-out speed from delaying so as to maintain a high-speed reading of the data.

Furthermore, since the capacitance regulation element is specially formed by the MOS transistor, an extremely thin gate insulation layer thereof can be used as a dielectric, thereby suppressing the increase of the chip size.

As described above, since the capacitance of the base potential of the bipolar transistor constituting the data input portion of the main sense amplifier is regulated by the capacitance regulation element, it is possible to set the potential drop time of the cascade wiring portion equal to the base potential drop time of the bipolar transistors when the potential drops at the side of the high source potential, thereby preventing the differential pair of the main sense amplifier from generating the cut-off condition even when the source $V_{CC}$ drops, so as to prevent the decrease of the reading speed and maintain a high-speed reading of the data.

Furthermore, since the capacitance regulation element is specifically formed by the MOS transistor, the extremely thin gate insulation layer thereof can be used as a dielectric, thereby suppressing the increase of the chip size.

DETAILED DESCRIPTION OF THE PREFERRED EMBODIMENTS

There will be described in detail preferred embodiments of the present invention in reference with the attached drawings.

Figure 5:
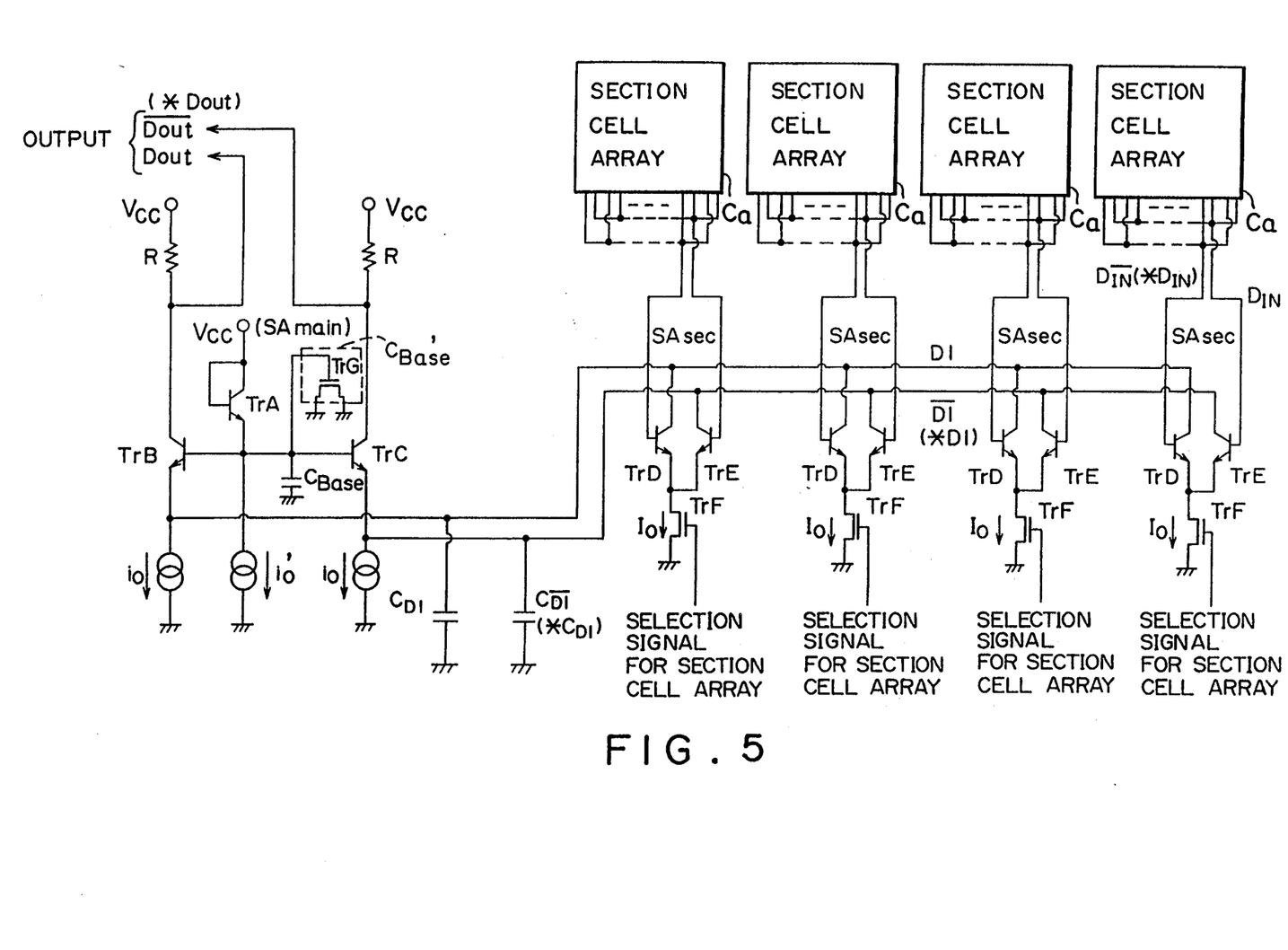
FIG. 5 is circuit diagram showing a cascade sense amplifier according to an embodiment of the present invention with its capacitive constitution.

FIG. 5 shows a circuitry of the cascade sense amplifier according to an embodiment of the present invention. In this figure, elements the same as those shown in FIG. 1 are attached by the same symbols in FIG. 1 and description of these elements are omitted.

In FIG. 5, symbol $C'_{Base}$ denotes a capacitance regulation element according to the present invention. The capacitance regulation element $C'_{Base}$ is provided between a ground (GND) potential $V_{SS}$ and bases of the differential pair bipolar transistors $Tr_B$ and $Tr_C$ which constitute a data input terminal of the main sense amplifier ($SA_{min}$). Accordingly, the capacitance regulation element $C'_{Base}$ is connected in parallel with the parasitic capacitance $c_{Base}$.

In FIG. 5, symbols Ca show section cell array and each of the array Ca opposes a section divided sense amplifier $SA_{sec}$. The sense amplifier $SA_{sec}$ includes a differential pair comprised of npn-type transistors $Tr_D$ and $Tr_E$, and a constant current source comprised of an N-channel MOS transistor $Tr_F$.

Emitters of the transistors $Tr_D$ and $Tr_E$ are commonly connected to a drain of the transistor $Tr_F$ which has a gate receiving a section cell array selection signal. A base of the transistor $Tr_E$ is connected to a data line $D_{IN}$ from the cell array Ca, while a base of the transistor $Tr_D$ is connected to a data line $*D_{IN}$ from the cell array Ca. By this, when the data line $D_{IN}$ is logic "1" and the data line $*D_{IN}$ is logic "0", and at the same time when the selection signal to the transistor $Tr_F$ is logic "1", the transistor $Tr_E$ is turned on and the transistor $Tr_D$ is turned off, thereby supplying only to the transistor $Tr_E$ a current having a value which is determined by the constant current source of the transistor $Tr_F$. Further, when the data line $D_{IN}$ is logic "0" and the data line $*D_{IN}$ is logic "1", and at the same time when the selection signal to the transistor $Tr_F$ is logic "1", the transistor $Tr_E$ is turned off and the transistor $Tr_D$ is turned on, thereby supplying only to the transistor $Tr_D$ a current having a value which is determined by the constant current source of the transistor $Tr_F$. The collectors of the transistors $Tr_D$ are commonly connected to a shared cascade wire $D_1$ which is commonly provided in entire section divided sense amplifiers $SA_{SEC}$, and also, the collectors of the transistors $Tr_E$ are commonly connected to a shared cascade wire $*D_1$ which is commonly provided in entire section divided sense amplifiers $SA_{SEC}$. A main sense amplifier $SA_{main}$ is provided at ends of the cascade wires $D_1$ and $*D_1$. The main sense amplifier $SA_{main}$ comprises NPN-type transistors $Tr_B$ and $Tr_C$ forming a differential pair, an NPN-type transistor $Tr_A$ which is connected by a diode connection and provided for a bias, a constant current source iO for biases corresponding to each of the transistors $Tr_B$ and $Tr_C$ of the differential pair, a constant current source iO' for a bias corresponding to the transistor $Tr_A$, and output resistors R.

The transistor $Tr_A$ is inserted between a power source $V_{CC}$ and bases of the transistors $Tr_B$ and $Tr_C$ for biasing these transistors $Tr_B$ and $Tr_C$ in cooperation with the constant current source iO'. The cascade wire $D_1$ is connected to an emitter of the transistor $Tr_B$, thereby supplying to a collector of the transistor $Tr_B$ a current having a value which is determined by a constant current source iO and a collector current of the transistor $Tr_D$ the sense amplifier $SA_{sec}$. The cascade wire $*D_1$ is connected to an emitter of the transistor $Tr_C$, thereby supplying to a collector of the transistor $Tr_C$ a current having a value which is determined by a constant current source iO and a collector current of the transistor $Tr_E$ of the sense amplifier $SA_{sec}$.

The resistors R are respectively inserted into the transistors $Tr_B$ and $Tr_C$ and the power sources $V_{CC}$, and each of the collector currents thereof is converted by each resistor R. An output of the resistor R on the side of the transistor $Tr_B$ is supplied to an output line $D_{out}$, and an output of the resistor R on the side of the transistor $Tr_C$ is supplied to an output line $*D_{out}$.

Figure 6:
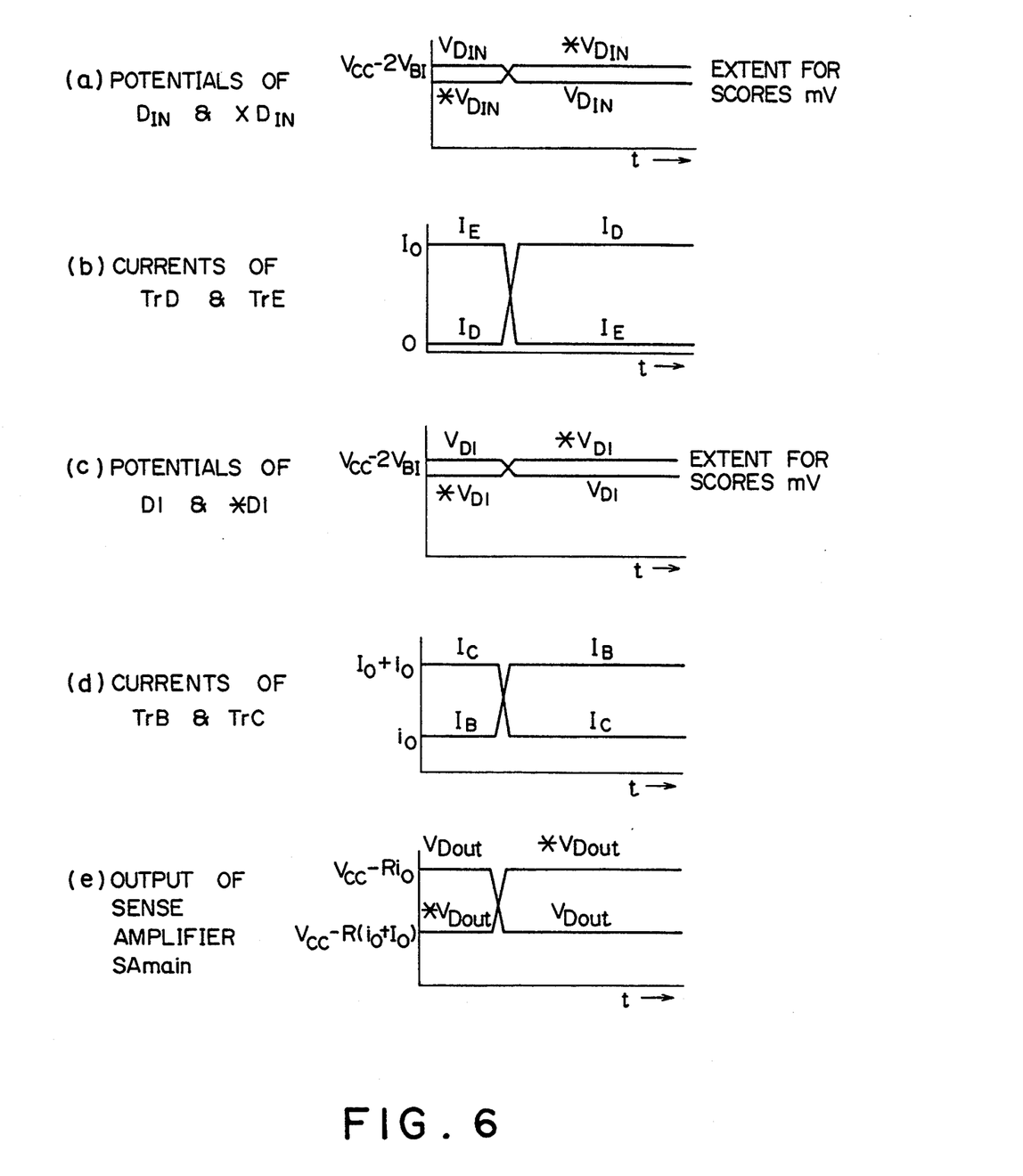
FIG. 6 is a timing chart showing a basic operation of the cascade sense amplifier shown in FIG. 5.

There is shown in FIG. 6 a circuit operation when one of the section cell arrays constructed in such the device is selected.

A value of "$V_{CC}-2V_{BI}$" shows a logic "1" in the data lines $D_{IN}$ and $*D_{IN}$ from the cell arrays. Here, $V_{BI}$ means a built-in voltage of the PN-junction. A logic "0" is set to "$(V_{CC}-2V_{BI})$—scores mV" in the data line $D_{IN}$ and $*D_{IN}$ from the cell array Ca. In FIG. 6(a) showing the potential of respective data lines $D_{IN}$ and $*D_{IN}$, the item of $(V_{CC}-2V_{BI})$ corresponds to the logic "1", and the level of the side scores mV lower than $(V_{CC}-2V_{BI})$ corresponds to the logic "0".

In the cascade wires $D_1$ and $*D_1$, the logic "1" corresponds to $(V_{CC}-2V_{BI})$ on the basis of the built-in voltage of the transistors $TF_A$ and $Tr_B$ (or $Tr_C$), and the logic "0" corresponds to the level scores mV lower than $(V_{CC}-2V_{BI})$.

Furthermore, in the sense output lines $D_{out}$ and $*D_{out}$, the logic "1" is represented by $(V_{CC}-R.i_O)$ and the logic "0" is represented by $\{V_{CC}-R(i_O+I_O)\}$.

When the data line $D_{IN}$ is the logic "1" and the data line $*D_{IN}$ is the logic "0", since the transistor $Tr_E$ is turned on and the transistor $Tr_D$ is turned off as described above, the current $I_O$ flows in the transistor $Tr_E$ and does not flow in the transistor $Tr_D$ as shown in FIG. 6(b). Accordingly, since the current $I_O$ flows to the cascade wire $*D_1$ and does not flow to the cascade wire $D_1$, as shown in FIG. 6(c), the potential $V_{D1}$ of the cascade wire $D_1$ is $(V_{CC}-2V_{BI})$, and the potential $*V_{D1}$ of the cascade wire $*D_1$ is $(V_{CC}-2V_{BI}-$scores mV). Therefore, as shown in FIG. 6(d), the current $I_O$ of the cascade wire $*D_1$ and the current $i_O$ of the constant current source flow in the transistor $Tr_C$, and only the current $i_O$ of the constant current source flows in the transistor $Tr_B$. Accordingly, the voltage drop is $(i_O+I_O)$ at the collector resistor R of the transistor $Tr_B$, and the potential $*V_{Dout}$ of the output line $*D_{out}$ is $\{(V_{CC}-R(i_O+I_O))\}$. On the other hand, the voltage drop is $R(i_O)$ at the collector resistor R of the transistor $Tr_B$, and the potential $V_{Dout}$ of the output line $D_{out}$ becomes $(V_{CC}-R.i_O)$.

In such a condition, when the potential of the data line $D_{IN}$ is inverted into the logic "0" and the potential $*D_{IN}$ is inverted into the logic "1", the current of the transistor $Tr_D$ changes from zero to $I_O$ and the current of the transistor $Tr_E$ changes from $I_O$ to zero. Since the transistor $Tr_E$ does not supply the current, the cascade wire $*D_1$ charges the potential of scores mV by the transistor $Tr_C$ to be $(V_{CC}-2V_{BI})$. On the other hand, since the transistor $Tr_D$ starts to flow the current $I_O$, the cascade wire $D_1$ drops the potential of scores mV from $(V_{CC}-2V_{BI})$. Therefore, the transistor $Tr_C$ has the flowing current $i_O$ of the constant current source, and the transistor $Tr_B$ has the flowing current $I_O$ of the cascade wire $D_1$ and the current $i_O$ of the constant current source. Accordingly, the voltage drop is "$R.i_O$" at the collector resistor R of the transistor $Tr_C$, and the potential $*V_{Dout}$ of the output line $*D_{out}$ is $(V_{CC}-R.i_O)$. On the other hand, the voltage drop is "$R.(i_O+I_O)$" at the collector resistor R of the transistor $Tr_B$, and the potential $V_{Dout}$ of the output line $D_{out}$ is $\{V_{CC}-R(i_O+I_O)\}$.

The above-mentioned capacitance regulation element $C'_{Base}$ is comprised of an N-channel MOS transistor $Tr_C$ having a gate connected to the bases of the transistors $Tr_B$ and $Tr_C$, and both a source and a drain connected to the ground (GND) potential. Accordingly, the dielectric of the element $C'_{Base}$ is comprised of the gate oxide layer of the transistor $Tr_G$. The capacitance regulation element $C'_{Base}$ has a capacitive value which is set in the manner that the potential drop time of the bases in the transistors $Tr_B$ and $Tr_C$ is equal to the potential drop time of the cascade wires $D_1$ and $*D_1$ when the potential of the higher potential side drops.

Figure 7:
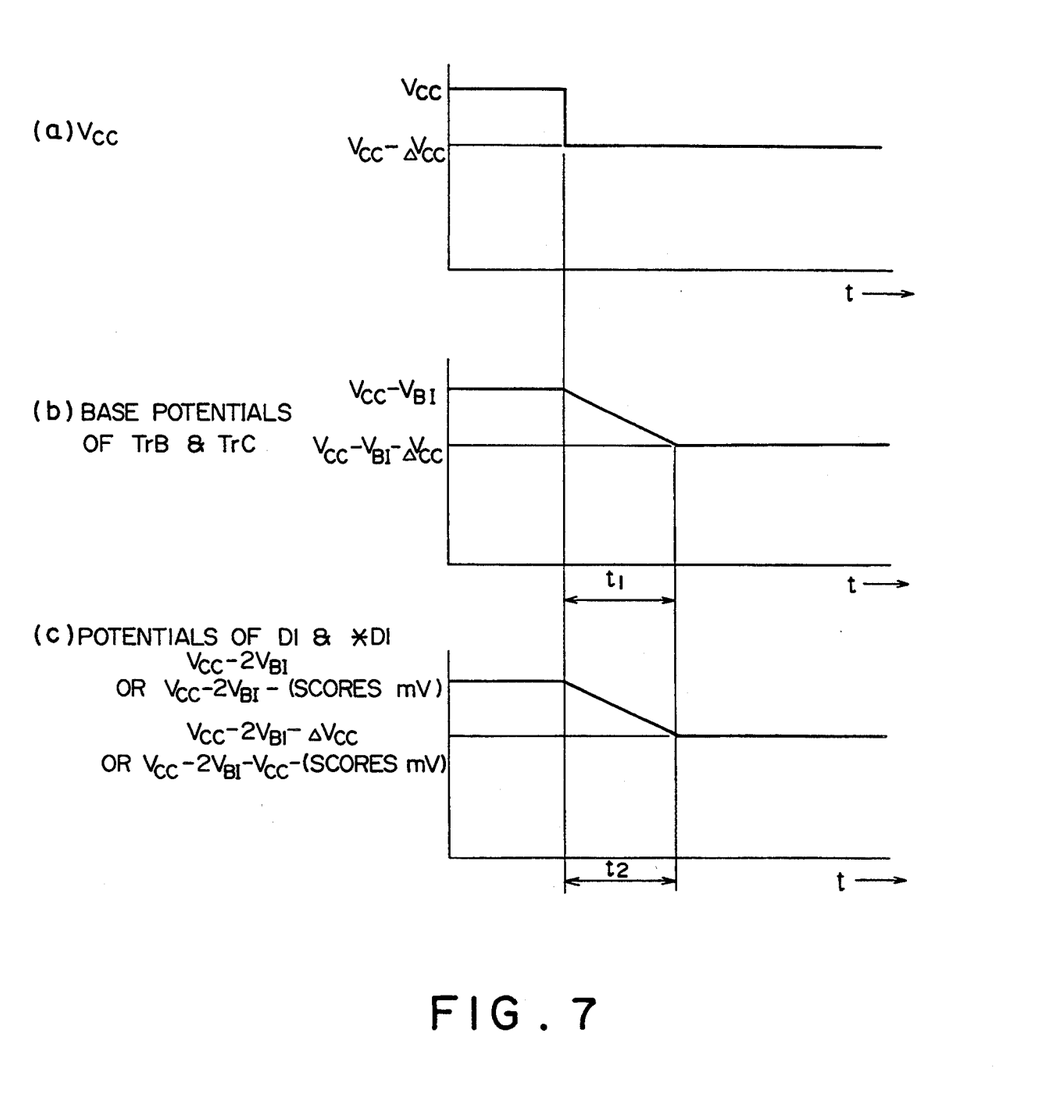
FIG. 7 is a timing chart showing a waveform complying condition of the base potential drop of the input transistor and the potential drop of the cascade wiring portion which constitute the main sense amplifier when the source potential drops in the amplifier shown in FIG. 5.

Therefore, as shown in FIG. 7, in the cascade sense amplifier of this embodiment, even though the power source $V_{CC}$ drops, the drop time $t_1$ of the base potential $V_B$ is equal to the potential drop time $t_2$ of the cascade wires $D_1$ and $*D_1$ when the source $V_{CC}$ drops.

By this, even though the power source $V_{CC}$ drops, it is possible to satisfy the relationship of "$V_{BE}>V_{BI}+\alpha$" with respect to the voltages $V_{BE}$ between the bases and emitters of the transistors $Tr_B$ and $Tr_C$, thereby maintaining an ON-condition of the transistors $Tr_B$ and $Tr_C$.

Figure 8:
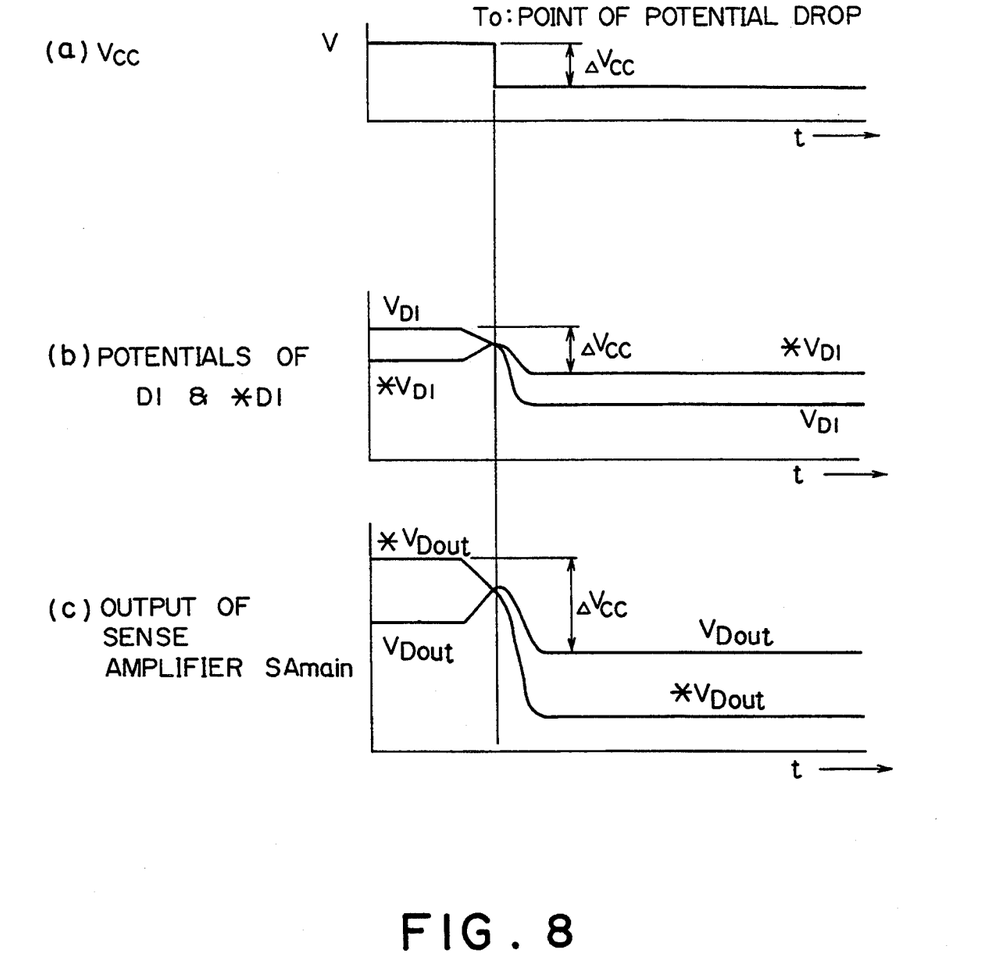
FIG. 8 is a timing chart showing a waveform complying condition of the potential of the cascade wiring portion and the sense output of the main sense amplifier at inverting the data line potential when the source potential drops in the amplifier shown in FIG. 5.

Accordingly, as shown in FIG. 8, an output of the main sense amplifier is stable, and there is no cut-off condition in the transistors $TF_B$ and $Tr_C$ even though the power source $V_{CC}$ drops, so as to prevent the delay of the read-out speed, thereby enabling a high speed and high sense reading of the data.

Furthermore, since the capacitance regulation element is specifically comprised of the MOS transistor having a gate oxide layer constituted by a thin dielectric, the element occupies only a small area, thereby preventing the chip size from increasing.

Especially, since the MOS transistor is used as the capacitance regulation element, it is possible to realize a miniaturization of the capacitance regulation element according to a miniaturization of the MOS transistor. Accordingly, the capacitance regulation element contributes a further miniaturization and higher integration of the chip size in the future, thereby having an extreme promisingness and a higher usefulness.

Though there is described the embodiment of this invention, the present invention is not limited in the above embodiment.

For example, even though the amplifier of the above embodiment has the capacitance regulation element comprised of the N-channel MOS transistor, the element may be comprised of a P-channel MOS transistor. Furthermore, the element is not limited in the MOS, the element may adopt other transistors if they are at least metal insulation semiconductor (MIS) type transistors.

Furthermore, the element is not limited in the transistors, and the element may be constituted by a capacitor in which metal electrodes the same as the cascade wiring portion are formed on the substrate, or by a trench type capacitor. In conclusion, the capacitance regulation element may be formed by any kind of formations.

Still furthermore, even though the capacitance regulation element of the above-embodiment is constituted by setting a capacitance value in the manner that the drop time $t_1$ of the base potential of the bipolar transistor in the main sense amplifier is equal to the potential drop time $t_2$ of the cascade wiring portion, the capacitance value may be set to "$t_1>t_2$".

What is claimed is:

1. A cascade sense amplifier, comprising
   a plurality of section separated sense amplifiers, each of which opposes to each of section cell array, and which senses data stored in corresponding section cell array;
   a cascade wiring portion for commonly connecting a plurality of output ends of said plurality of section separated sense amplifier;
   a main sense amplifier having a bipolar transistor as a data input end and for amplifying each output from each of said section separated sense amplifiers through said cascade wiring portion; and
   a capacitance regulation element for regulating a capacitance of a base potential of said bipolar transistor constituting the data input end of said main sense amplifier.

2. The cascade sense amplifier according to claim 1 wherein said capacitance regulation element is comprised of an element for setting a capacitance equal to a capacitance of said cascade wiring portion.

3. The cascade sense amplifier according to claim 2 wherein said capacitance regulation element is comprised of an metal oxide semiconductor (MOS) transistor.

4. The cascade sense amplifier according to claim 2 wherein a capacitance value of said capacitance regulation element is set in a manner such that a potential drop time of a base of said bipolar transistor in said main sense amplifier is equal to a potential drop time of said cascade wiring portion when a power supply voltage of said sense amplifier fluctuates.

5. The cascade sense amplifier according to claim 1 wherein said capacitance regulation element is comprised of an N-channel MOS transistor.

6. The cascade sense amplifier according to claim 5 wherein a capacitance value of said capacitance regulation element is set in the manner that a potential drop time of a base of said bipolar transistor in said main sense amplifier is equal to a potential drop time of said cascade wiring portion when a power supply voltage of said sense amplifier fluctuates.

7. The cascade sense amplifier according to claim 1 wherein a capacitance value of said capacitance regulation element is set in the manner that a potential drop time of a base of said bipolar transistor in said main sense amplifier is equal to a potential drop time of said cascade wiring portion when a power supply voltage of said sense amplifier fluctuates.

* * * * *